(12) United States Patent
Huang et al.

(10) Patent No.: US 8,937,308 B1
(45) Date of Patent: Jan. 20, 2015

(54) OXIDE SEMICONDUCTOR THIN FILM TRANSISTOR

(71) Applicant: Chunghwa Picture Tubes, Ltd., Taoyuan (TW)

(72) Inventors: Chin-Hai Huang, Taoyuan County (TW); Bo-Jhang Sun, Kaohsiung (TW); Szu-Chi Huang, Changhua County (TW)

(73) Assignee: Chunghwa Picture Tubes, Ltd., Longtan Township, Taoyuan County (TW)

( * ) Notice: Subject to any disclaimer, the term of this patent is extended or adjusted under 35 U.S.C. 154(b) by 0 days.

(21) Appl. No.: 14/020,900

(22) Filed: Sep. 9, 2013

(30) Foreign Application Priority Data

Jul. 1, 2013 (TW) .............................. 102123470 A

(51) Int. Cl.
*H01L 29/10* (2006.01)
*H01L 29/12* (2006.01)
*H01L 21/00* (2006.01)
*H01L 29/786* (2006.01)

(52) U.S. Cl.
CPC .................................. *H01L 29/7869* (2013.01)
USPC ........................................... 257/43; 438/104

(58) Field of Classification Search
USPC .......................................... 257/43; 438/104
See application file for complete search history.

(56) References Cited

U.S. PATENT DOCUMENTS

| 8,378,344 | B2 | 2/2013 | Sakakura | |
|---|---|---|---|---|
| 2010/0163865 | A1* | 7/2010 | Arai | 257/43 |
| 2010/0210056 | A1* | 8/2010 | Seo et al. | 438/34 |
| 2011/0058116 | A1 | 3/2011 | Yamazaki | |
| 2012/0286259 | A1* | 11/2012 | Park et al. | 257/43 |
| 2013/0277668 | A1* | 10/2013 | Yoo et al. | 257/43 |
| 2014/0061632 | A1* | 3/2014 | Lee et al. | 257/43 |

FOREIGN PATENT DOCUMENTS

TW 201037839 A1 10/2010

* cited by examiner

*Primary Examiner* — Karen Kusumakar
(74) *Attorney, Agent, or Firm* — Winston Hsu; Scott Margo

(57) ABSTRACT

An oxide semiconductor thin film transistor includes a substrate, a gate electrode, an oxide semiconductor layer, a gate insulation layer, an oxide source electrode, an oxide drain electrode and a metal connection component. The gate insulation layer is at least partially disposed between the gate electrode and the oxide semiconductor layer. The oxide source electrode and the oxide drain electrode are respectively disposed at least partially between the oxide semiconductor layer and the substrate. The metal connection component is disposed on the substrate, and the metal connection component overlaps the oxide source electrode in a vertical projective direction perpendicular to the substrate. The metal connection component does not overlap the oxide semiconductor layer in the vertical projective direction. Any portion of the metal connection component located in a region where the oxide source electrode overlaps the metal connection component directly contacts the oxide source electrode for forming electrical connection.

9 Claims, 10 Drawing Sheets

OXIDE SEMICONDUCTOR THIN FILM TRANSISTOR

BACKGROUND OF THE INVENTION

1. Field of the Invention

The present invention relates to an oxide semiconductor thin film transistor, and more particularly, to an oxide semiconductor thin film transistor including a source electrode and a drain electrode made of oxide.

2. Description of the Prior Art

In recent years, applications of flat display devices are rapidly developed. Electronics, such as televisions, cell phones, mobiles and refrigerators, are installed with flat display devices. A thin film transistor (TFT) is a kind of semiconductor devices commonly used in the flat display device, such as a liquid crystal display (LCD), an organic light emitting diode (OLED) display and an electronic paper (E-paper). The thin film transistor is employed to control voltage and/or current of a pixel of the flat display device for presenting a bright, a dark, or a gray level display effect.

According to different semiconductor materials applied in the thin film transistors, the thin film transistors in current display industries may includes amorphous silicon thin film transistors (a-Si TFTs), poly silicon thin film transistors, and oxide semiconductor thin film transistors. The process flexibility of the oxide semiconductor thin film transistor is better than that of the amorphous silicon thin film transistor, and the electrical mobility of the oxide semiconductor thin film transistor is higher than the electrical mobility of the amorphous silicon thin film transistor. Therefore, the oxide semiconductor thin film transistor is currently the front-runner in the competition of replacing the amorphous silicon thin film transistor in the display industry. The material and electrical properties of the oxide semiconductor layer tend to be influenced easily by the environment condition and the manufacturing process conditions. In the traditional back channel etch (BCE) structure, the oxide semiconductor layer tends to be damaged by follow-up processes such as a forming process of a metal source electrode and a metal drain electrode, and the electrical properties of the oxide semiconductor layer are affected accordingly. Therefore, a coplanar structure is also applied for the oxide semiconductor material in the related industries. In the coplanar structure, the metal source electrode and the metal drain electrode are formed before the process of forming the oxide semiconductor layer to keep the oxide semiconductor layer from being damaged. As shown in FIG. 1, in a conventional oxide semiconductor thin film transistor 100, a gate electrode 120G, a gate insulation layer 130, a metal source electrode 140S and a metal drain electrode 140D are formed sequentially on a substrate 110. An oxide semiconductor layer 150 is formed on the metal source electrode 140S, the metal drain electrode 140D and the gate insulation layer 130, which is uncovered by the metal source electrode 140S and the metal drain electrode 140D and disposed between the metal source electrode 140S and the metal drain electrode 140D, after the forming process of the metal source electrode 140S and the metal drain electrode 140D. A pixel electrode may contact the metal source electrode 140D uncovered by a protection layer 160 to be electrically connected to the metal source electrode 140D. In this coplanar structure, the oxide semiconductor layer 150 may be kept from being influenced by the manufacturing process of the metal source electrode 140S and the metal drain electrode 140D. However, the metal source electrode 140S and the metal drain electrode 140D are generally thicker than the oxide semiconductor layer 150, and edges or taper surfaces of the metal source electrode 140S and the metal drain electrode 140D may be uneven because of the influence of the etching process conditions. The covering condition of the oxide semiconductor layer 150 formed over the edges of the metal source electrode 140S and the metal drain electrode 140D may be bad, and the oxide semiconductor layer 150 may even be cracked over the edges of the metal source electrode 140S and the metal drain electrode 140D. The manufacturing yield and the electrical performance of the oxide semiconductor thin film transistor 100 may be seriously affected accordingly. Additionally, the contact resistance between the oxide semiconductor layer 150 and the metal source electrode 140S and the contact resistance between the oxide semiconductor layer 150 and the metal drain electrode 140D are relatively higher, and the electrical performance of the oxide semiconductor thin film transistor 100 may also be affected accordingly.

SUMMARY OF THE INVENTION

It is one of the objectives to provide an oxide semiconductor thin film transistor. An oxide source electrode and an oxide drain electrode are formed by an oxide conductive material. A coplanar thin film transistor structure is employed to make an oxide semiconductor layer being contacted from a bottom side of the oxide semiconductor layer. The oxide semiconductor layer may be kept from being influenced by a manufacturing process of the source/drain electrodes and the edge condition of the conventional metal source/drain electrodes. The contact resistance between the oxide semiconductor layer and the source/drain electrodes may also be lowered. The purposes of yield enhancement and improvement of the electrical performance of the oxide semiconductor thin film transistor may be achieved accordingly.

To achieve the purposes described above, a preferred embodiment provides an oxide semiconductor thin film transistor. The oxide semiconductor thin film transistor includes a substrate, a gate electrode, an oxide semiconductor layer, a gate insulation layer, an oxide source electrode, an oxide drain electrode and a metal connection component. The gate electrode and the oxide semiconductor layer are disposed on the substrate. The gate insulation layer is at least partially disposed between the gate electrode and the oxide semiconductor layer. The oxide source electrode and the oxide drain electrode are respectively disposed at least partially between the oxide semiconductor layer and the substrate. The metal connection component is disposed on the substrate, and the metal connection component overlaps the oxide source electrode in a vertical projective direction perpendicular to the substrate. The metal connection component does not overlap the oxide semiconductor layer in the vertical projective direction. Any portion of the metal connection component located in a region where the oxide source electrode overlaps the metal connection component directly contacts the oxide source electrode for forming electrical connection.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
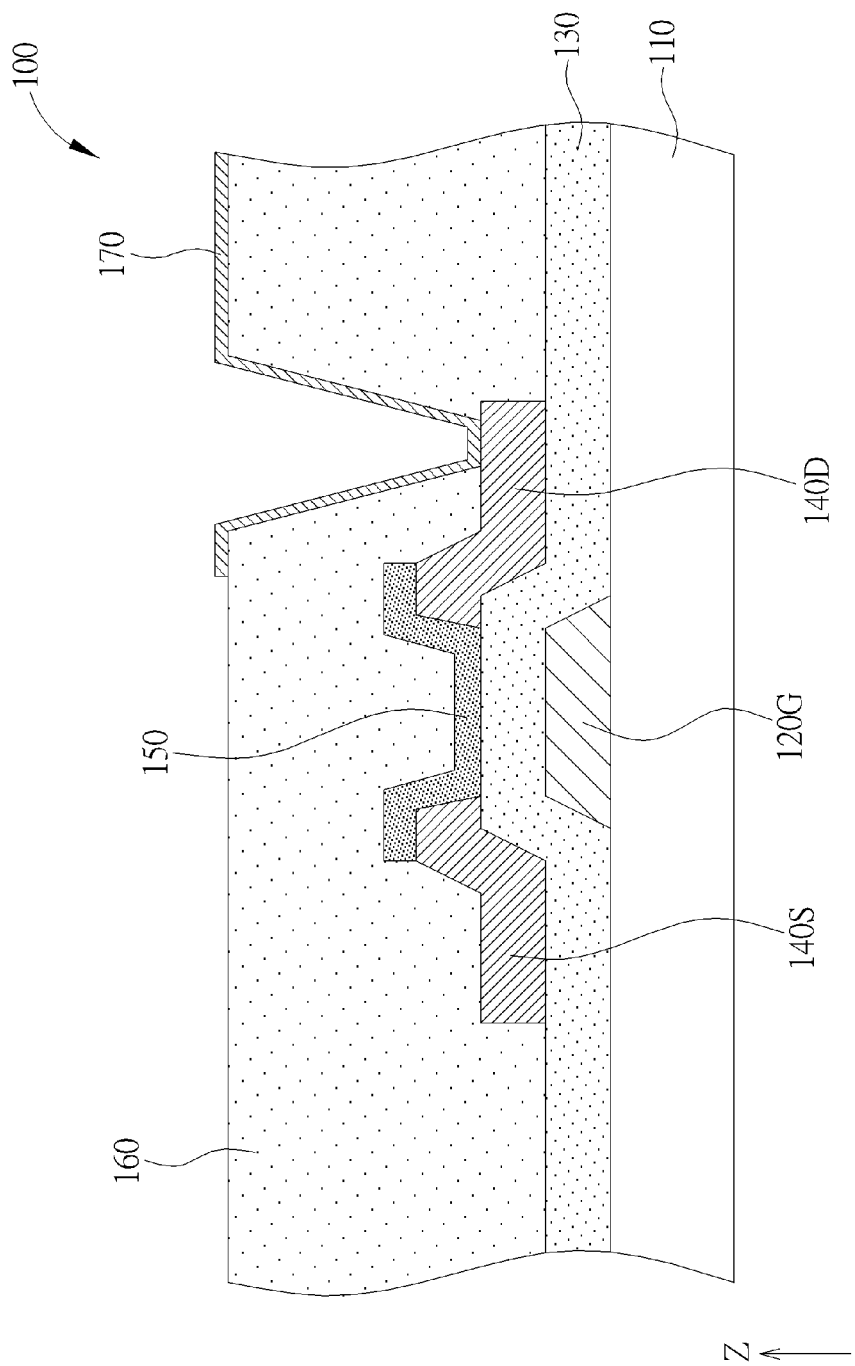
FIG. 1 is a schematic diagram illustrating a conventional oxide semiconductor thin film transistor.
Figure 2:
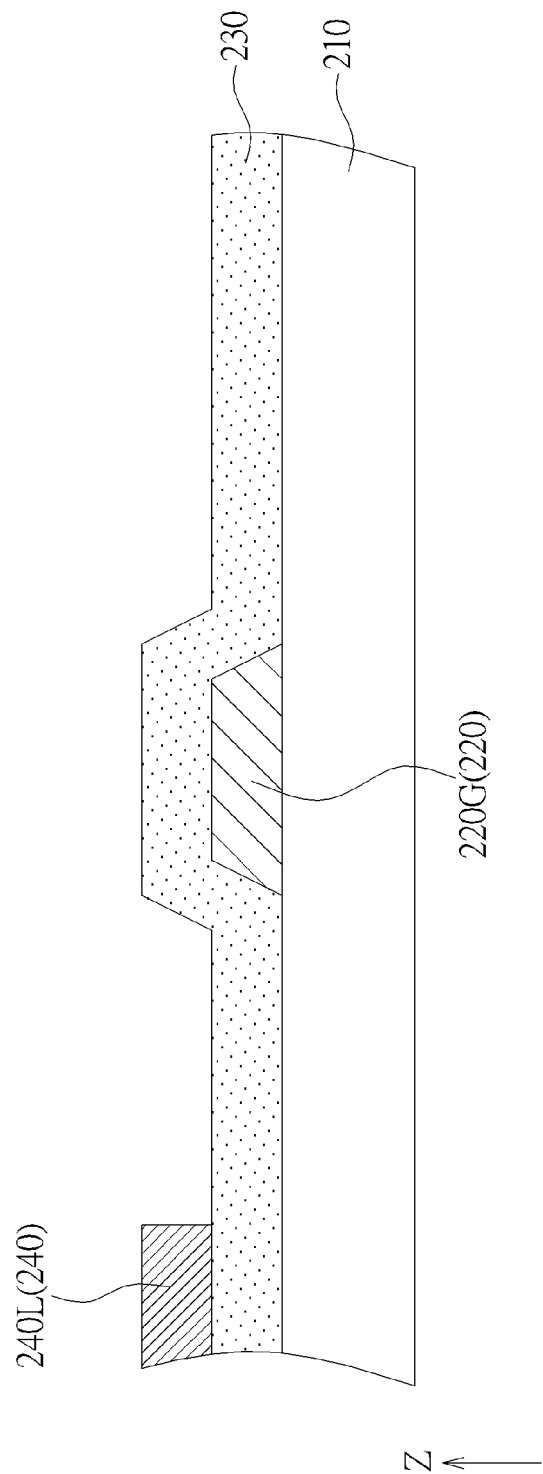
FIG. 2 and FIG. 3 are schematic diagrams illustrating a manufacturing method of an oxide semiconductor thin film transistor according to a first preferred embodiment of the present invention.
Figure 3:
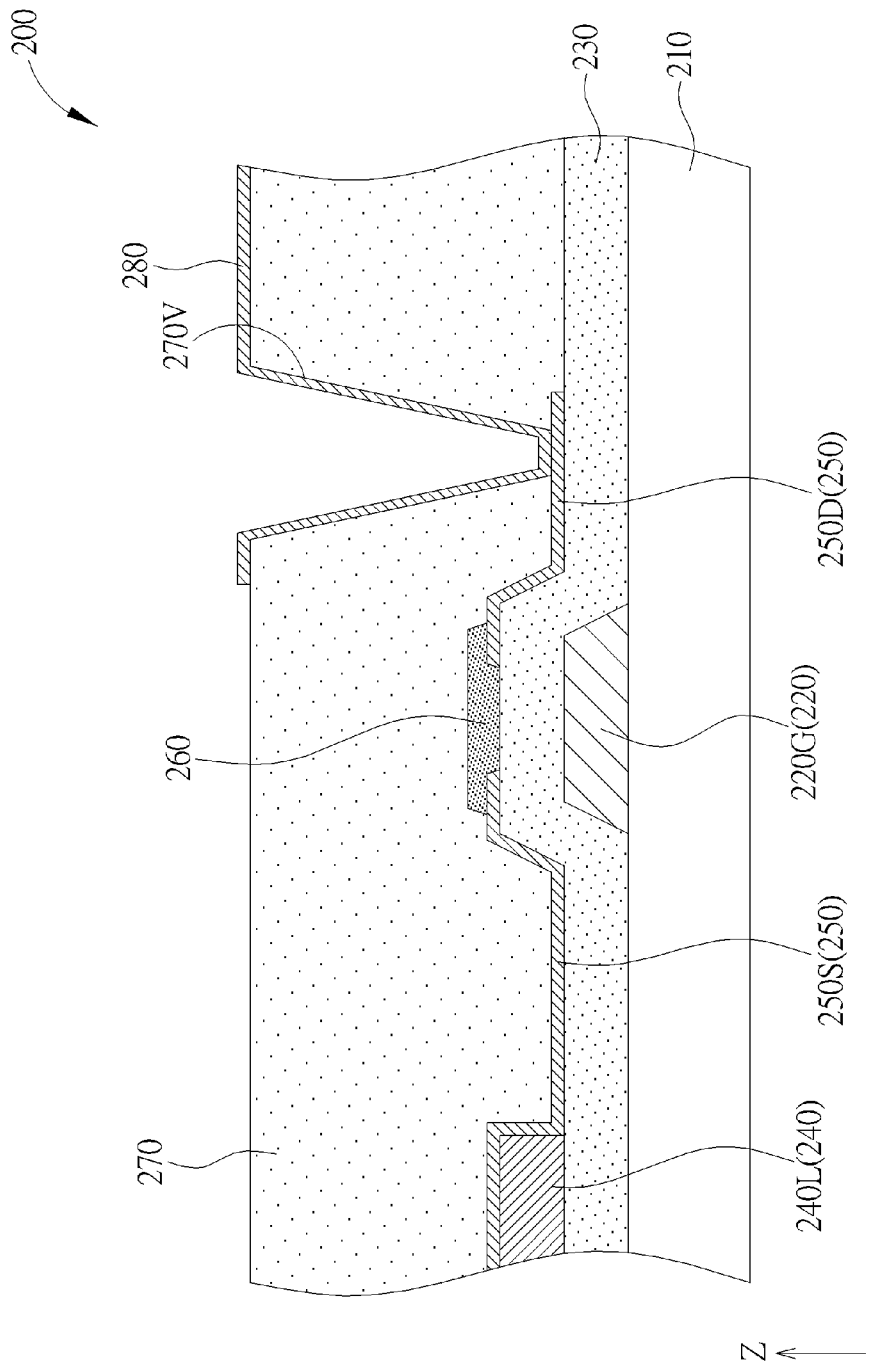

Please refer to FIG. 2 and FIG. 3. FIG. 2 and FIG. 3 are schematic diagrams illustrating a manufacturing method of an oxide semiconductor thin film transistor according to a first preferred embodiment of the present invention. The manufacturing method includes the following steps. As shown in FIG. 2, a substrate 210 is provided first. The substrate 210 may include a solid substrate such as a glass substrate and a ceramic substrate, a flexible substrate such as a plastic substrate, or other substrates made from appropriate materials. A gate electrode 220G, a gate insulation layer 230 and a metal connection component 240L are then formed sequentially on the substrate 210. The gate electrode 220G may be formed by performing a patterning process, such as a photolithographic process, to a first metal layer 220, and the metal connection component 240L may be formed by performing a patterning process to a second metal layer 240, but not limited thereto. The materials of the first metal layer 220 and the second metal layer 240 may include metal materials such as at least one of aluminum (Al), copper (Cu), silver (Ag), chromium (Cr), titanium (Ti) and molybdenum (Mo), a composite layer of the above-mentioned materials, or an alloy of the above-mentioned materials, but not limited thereto. In addition, the metal connection component 240L does not overlap the gate electrode 220G in a vertical projective direction Z perpendicular to the substrate 210.

Subsequently, as shown in FIG. 3, an oxide source electrode 250S and an oxide drain electrode 250D are formed on the gate insulation layer 230. The oxide source electrode 250S and the oxide drain electrode 250D may be formed by performing a patterning process, such as a photolithographic process, to an oxide conductive layer 250, but not limited thereto. The oxide conductive layer 250 may include oxide conductive material such as indium tin oxide (ITO), indium zinc oxide (IZO), aluminum zinc oxide (AZO), or other appropriate oxide conductive materials. An oxide semiconductor layer 260, a protection layer 270 and a pixel electrode 280 are then formed sequentially. The oxide semiconductor layer 260 may include a group II-VI compound (such as zinc oxide, ZnO), a group II-VI compound doped with alkali earth metal (such as magnesium zinc oxide, ZnMgO), a group II-VI compound doped with group IIIA element (such as indium gallium zinc oxide, IGZO), a group II-VI compound doped with group VA element (such as stannum stibium oxide, $SnSbO_2$), a group II-VI compound doped with group VIA element (such as zinc selenium oxide, ZnSeO), a group II-VI compound doped with transition metal (such as zinc zirconium oxide, ZnZrO), or other semiconductor oxide made by mixing the above-mentioned elements, but not limited thereto. The protection layer 270 and the gate insulation layer 230 may respectively include inorganic materials such as silicon nitride, silicon oxide or silicon oxynitride, organic materials such as acrylic resin, or other appropriate materials. The pixel electrode 280 may include indium tin oxide, indium zinc oxide, aluminum zinc oxide, or other appropriate transparent conductive materials.

As shown in FIG. 3, an oxide semiconductor thin film transistor 200 is provided in this embodiment. The oxide semiconductor thin film transistor 200 includes the substrate 210, the gate electrode 220G, the gate insulation layer 230, the oxide source electrode 250S, the oxide drain electrode 250D, the oxide semiconductor layer 260 and the metal connection component 240L. The gate electrode 220G and the oxide semiconductor layer 260 are disposed on the substrate 210. The gate insulation layer 230 is at least partially disposed between the gate electrode 220G and the oxide semiconductor layer 260. The oxide source electrode 250S and the oxide drain electrode 250D are respectively disposed at least partially between the oxide semiconductor layer 260 and the substrate 210. The oxide semiconductor thin film transistor 200 in FIG. 3 is regarded as a coplanar thin film transistor structure. In this coplanar thin film transistor structure, the oxide source electrode 250S and the oxide drain electrode 250D are formed before the process of forming the oxide semiconductor layer 260 to contact the oxide semiconductor layer 260 from the bottom side of the oxide semiconductor layer 260. The oxide semiconductor layer 260 may be kept from being influenced by the manufacturing process of the oxide source electrode 250S and the oxide drain electrode 250D because the oxide source electrode 250S and the oxide drain electrode 250D are formed before the forming process of the oxide semiconductor layer 260. Additionally, the thicknesses of the oxide source electrode 250S and the oxide drain electrode 250D are similar to the thickness of the oxide semiconductor layer 260 (generally around 50 nanometers to 100 nanometers), and cracking issues of the oxide semiconductor layer 260 at the edge of the oxide source electrode 250S and the oxide drain electrode 250D may be improved accordingly. The oxide source electrode 250S, the oxide drain electrode 250D and the oxide semiconductor layer 260 are all made from oxide and have similar energy levels. The contact resistance between the oxide semiconductor layer 260 and the oxide source electrode 250S and the contact resistance between the oxide semiconductor layer 260 and the drain electrode 250D may be reduced accordingly.

However, electrical resistivity of oxide conductive material is generally higher than that of metal material. In the oxide semiconductor thin film transistor 200 of this embodiment, the metal connection component 240L disposed on the substrate 210 may be electrically connected to the oxide source electrode 250S to reduce electrical resistance of transmitting source signals. The metal connection component 240L may include such as data lines in an array substrate or other connection components electrically connected to the data lines to transmit the source signals from the data lines to the oxide source electrode 250S, but not limited thereto. It is worth noting that the metal connection component 240L is formed before the process of forming the oxide semiconductor layer 260, and the metal connection component 240L does not overlap the oxide semiconductor layer 260 in the vertical projective direction Z. The manufacturing process of the metal connection component 240L will not influence the oxide semiconductor layer 260, and the oxide semiconductor layer 260 will not be influenced by edge surface condition of the metal connection component 240L. Additionally, in this embodiment, the oxide source electrode 250S is formed after the process of forming the metal connection component 240L to cover the metal connection component 240L. The metal connection component 240L is disposed between the oxide source electrode 250S and the substrate 210, and the metal connection component 240L overlaps and directly contacts the oxide source electrode 250S. In other words, any portion of the metal connection component 240L located in a region where the oxide source electrode 250S overlaps the metal connection component 240 directly contacts the oxide source electrode 250S for forming electrical connection.

Figure 4:
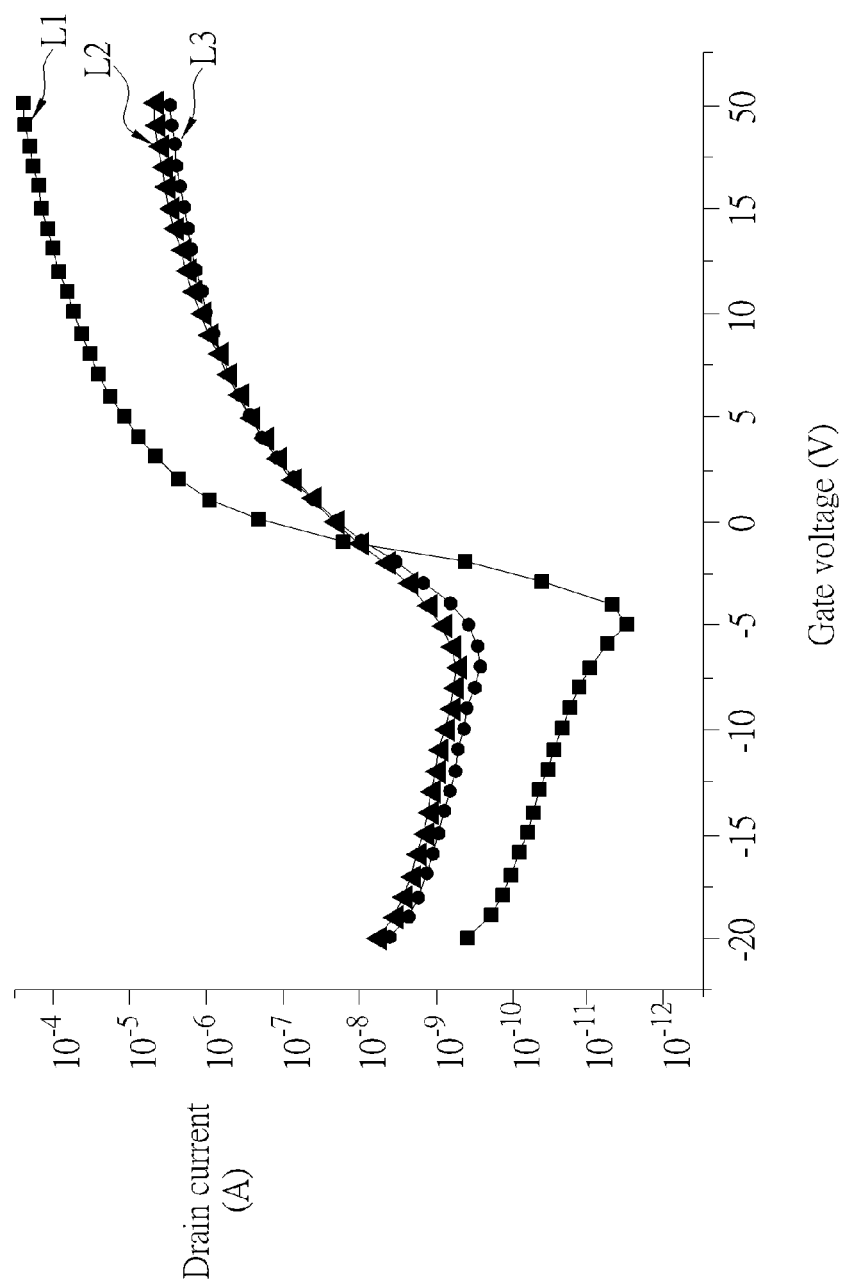
FIG. 4 is a schematic diagram illustrating an I (drain current)-V (gate voltage) curve of the oxide semiconductor thin film transistor in the present invention.

As shown in FIG. 3, the oxide semiconductor thin film transistor 200 may further include the protection layer 270, a first contact opening 270V and the pixel electrode 280. The protection layer 270 covers the gate electrode 220G, the gate insulation layer 230, the oxide semiconductor layer 260, the oxide source electrode 250S, the oxide drain electrode 250D and the metal connection component 240L. The gate electrode 220G is disposed between the substrate 210 and the gate insulation layer 230. The first contact opening 270V is disposed on the protection layer 270 and at least partially exposes the oxide drain electrode 250D. The pixel electrode 280 is disposed on the protection layer 270, and the pixel electrode 280 is electrically connected to the oxide drain electrode 250D via the first contact opening 270V. The contact resistance between the oxide drain electrode 250D and the pixel electrode 280 may also be reduced because the oxide drain electrode 250D and the pixel electrode 280 are made from oxide conductive materials and have similar energy levels. In the present invention, the oxide source electrode 250S, the oxide drain electrode 250D and the oxide semiconductor layer 260 are employed to enhance manufacturing yield and electrical properties of the oxide semiconductor thin film transistor 200. For example, please refer to FIG. 4. FIG. 4 is a schematic diagram illustrating an I (drain current)-V (gate voltage) curve of the oxide semiconductor thin film transistor in the present invention and I-V curves of oxide semiconductor thin film transistors of two control groups. In FIG. 4, the x-axis stands for gate voltages, and the y-axis stands for drain currents. A curve L1 is an I-V curve of the oxide semiconductor thin film transistor of the present invention, a curve L2 is an I-V curve of an oxide semiconductor thin film transistor having source/drain electrodes made from molly tantalum (MoTa) alloy, and a curve L3 is an I-V curve of an oxide semiconductor thin film transistor having source/drain electrodes made from molly niobium (MoNb) alloy. As shown in FIG. 4, compared with the control group oxide semiconductor thin film transistors having normal metal source/drain electrodes, the oxide semiconductor thin film transistor, which includes the oxide source electrode and the oxide drain electrode, in the present invention has obviously better on current ($I_{on}$), off current ($I_{off}$) and threshold voltage ($V_{th}$). The on current, the off current and the threshold voltage are the general indexes to evaluate the electrical performance of the thin film transistor. Therefore, the electrical performance of the oxide semiconductor thin film transistor in the present invention is obviously enhanced because of using the oxide conductive materials to form the source/drain electrodes.

Figure 5:
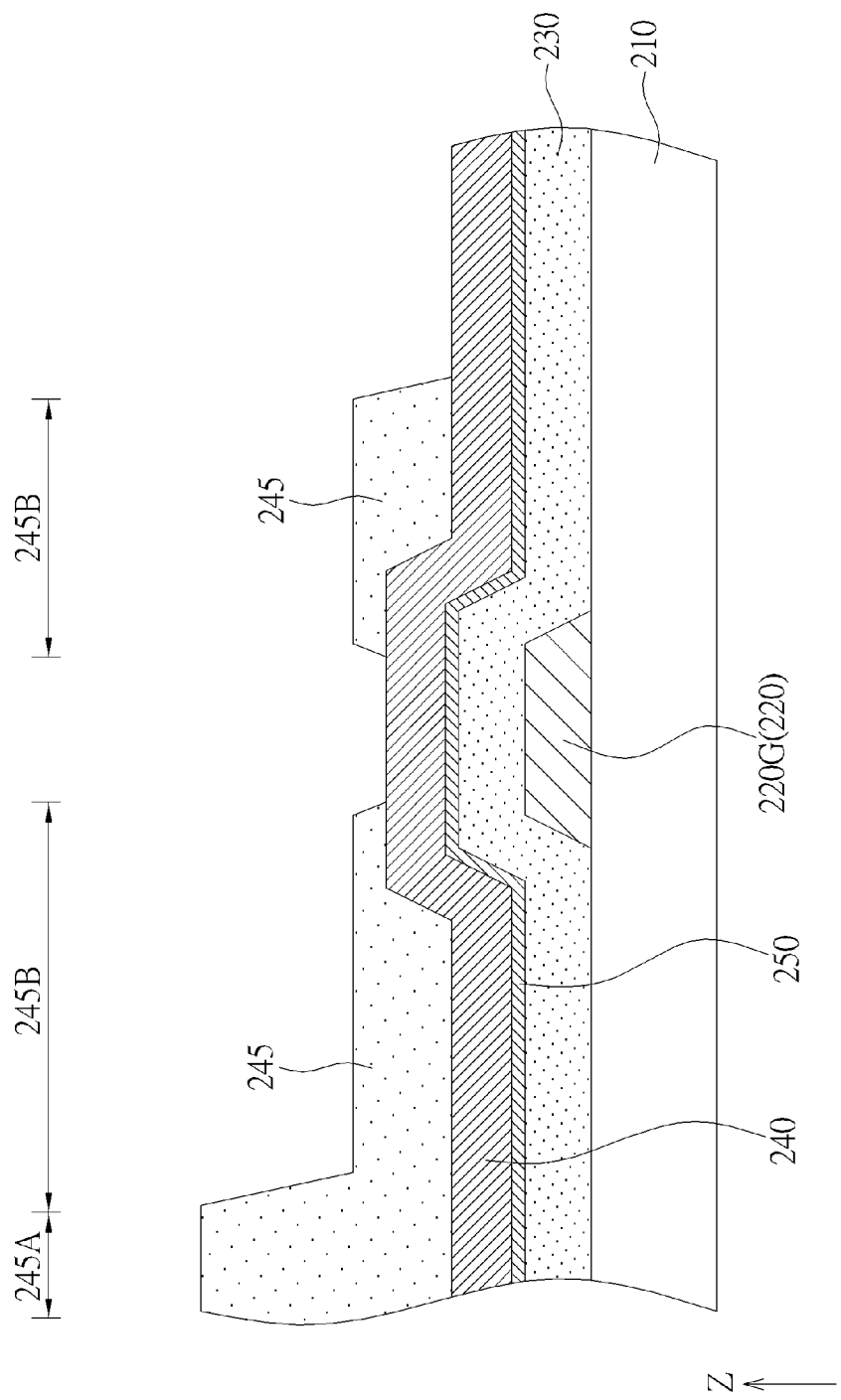
FIGS. 5-9 are schematic diagrams illustrating a manufacturing method of an oxide semiconductor thin film transistor according to a second preferred embodiment of the present invention.
Figure 6:
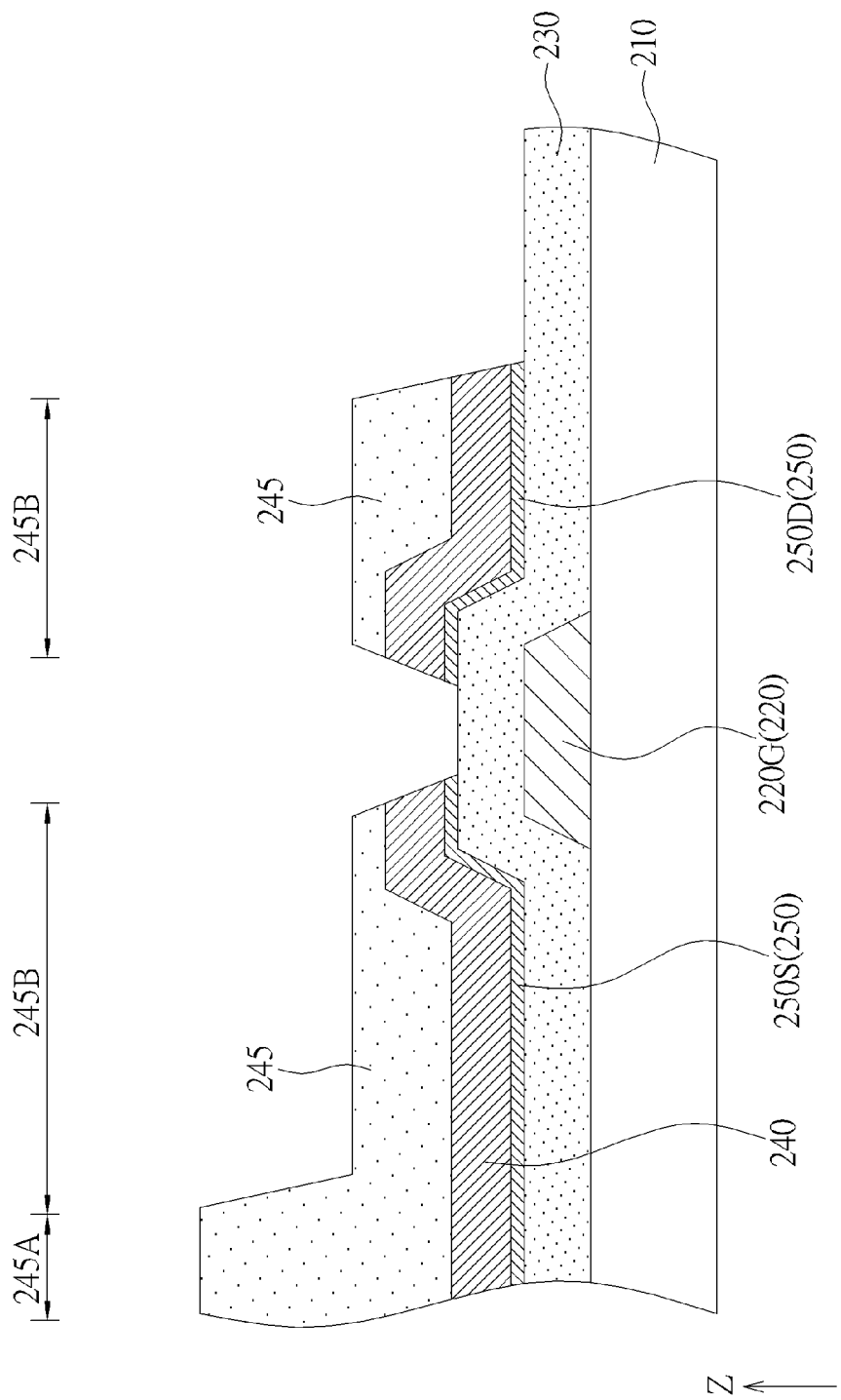
Figure 7:
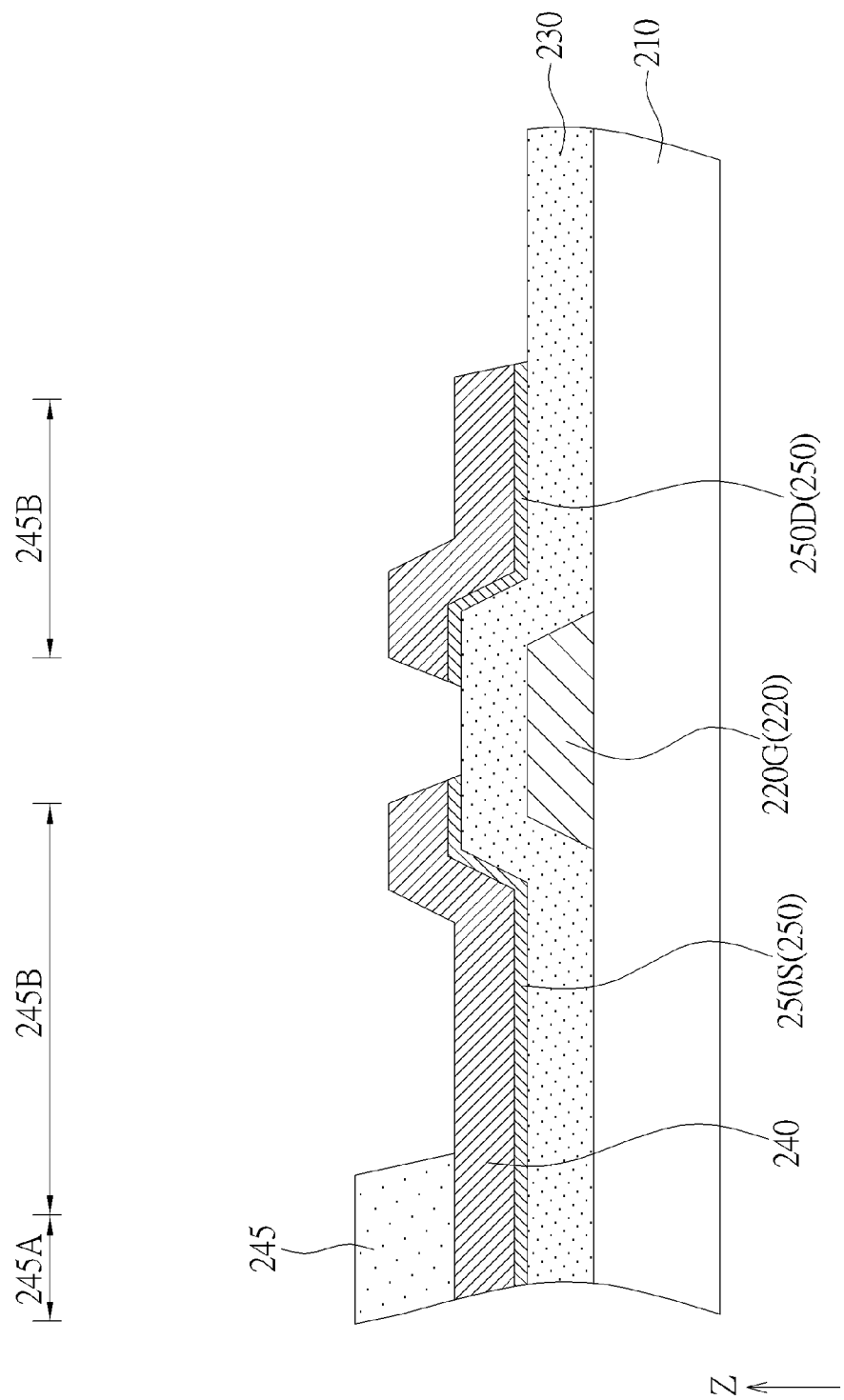
Figure 8:
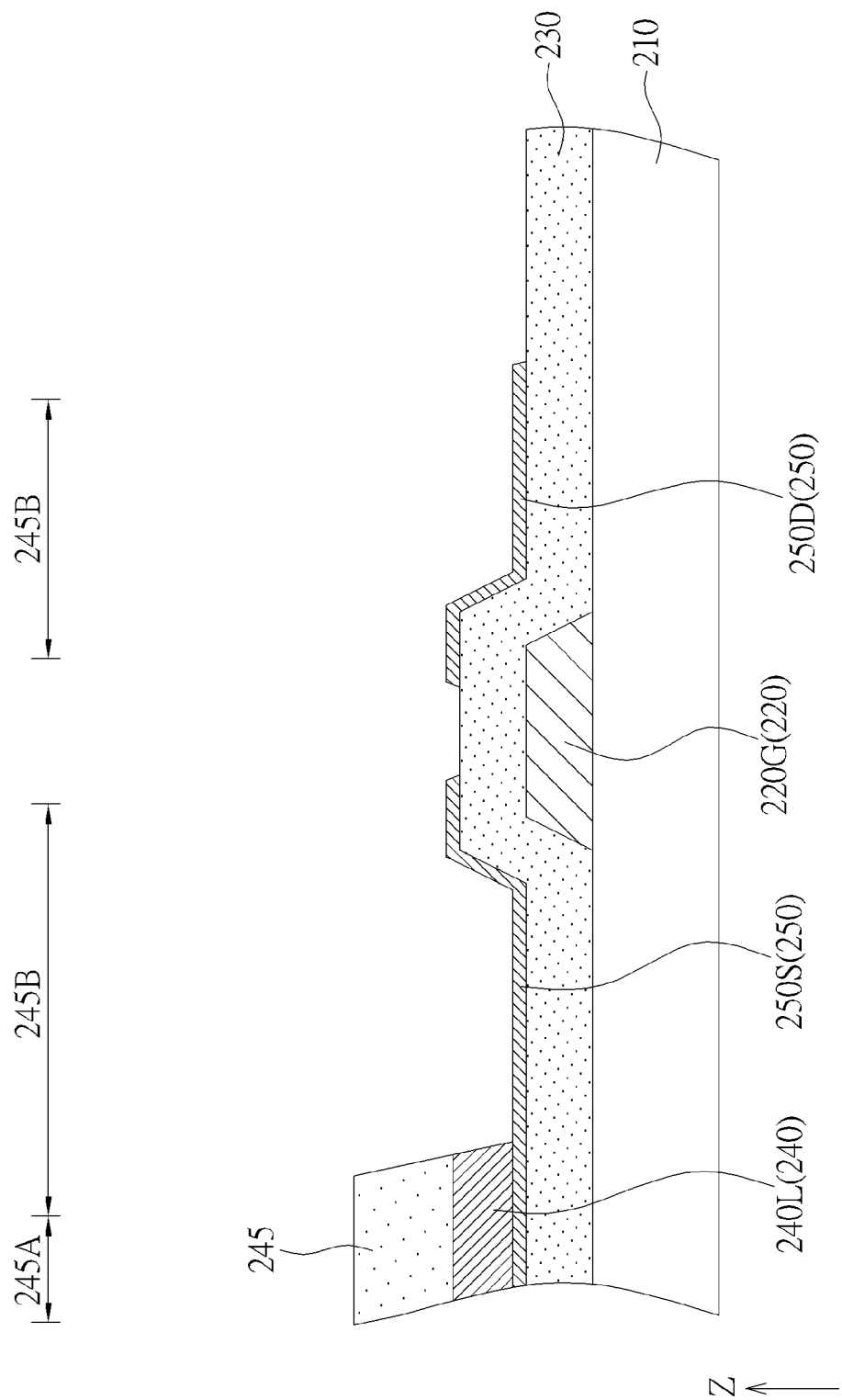
Figure 9:
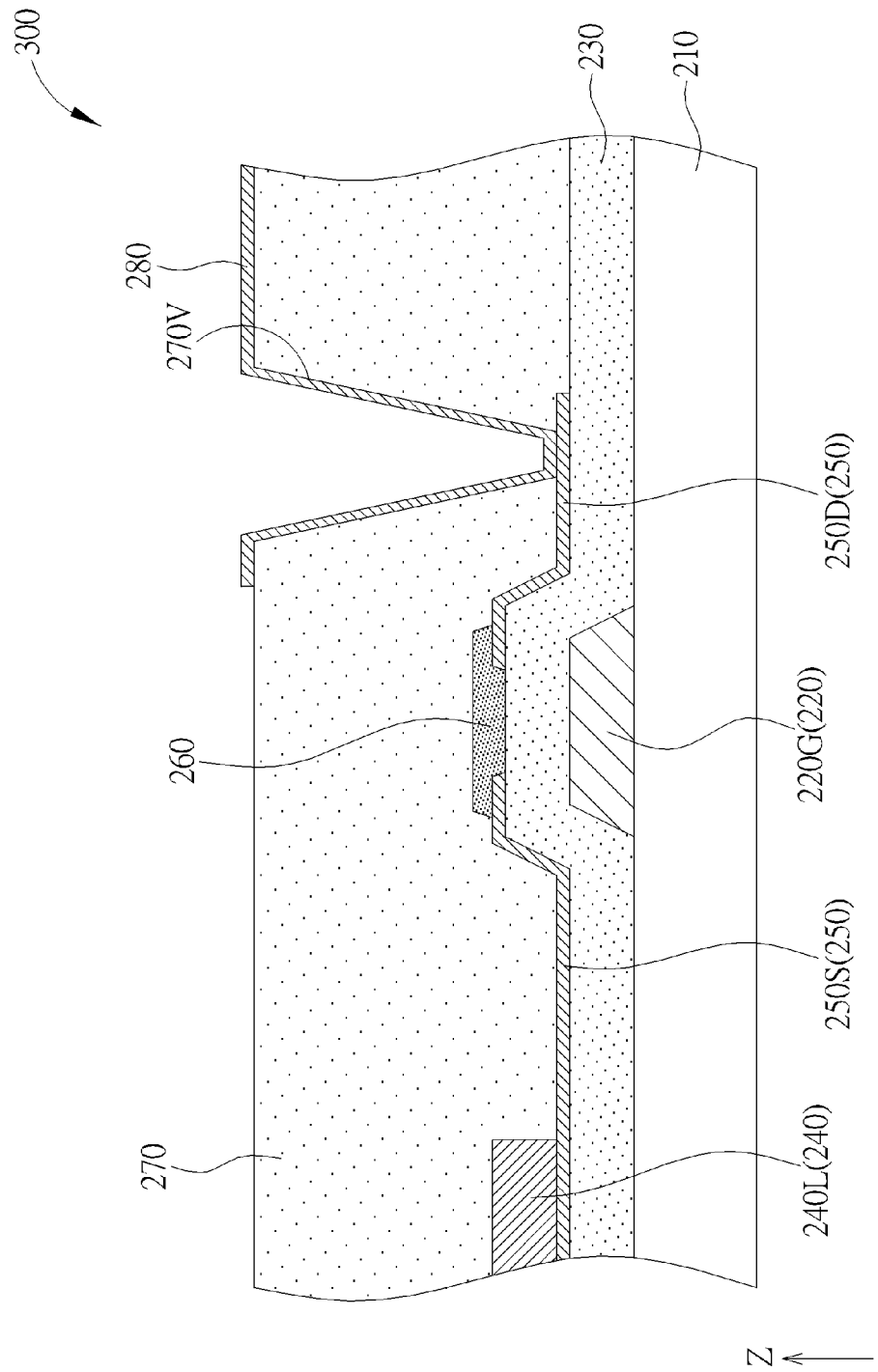

Please refer to FIGS. 5-9. FIGS. 5-9 are schematic diagrams illustrating a manufacturing method of an oxide semiconductor thin film transistor according to a second preferred embodiment of the present invention. A manufacturing method of an oxide semiconductor thin film transistor is provided in this embodiment and includes the following steps. As shown in FIG. 5, the gate electrode 220G, the gate insulation layer 230, the oxide conductive layer 250, the second metal layer 240 and a patterned photoresist layer 245 are formed sequentially on the substrate 210. The patterned photoresist layer 245 may be formed by a gray-tone mask or a half-tone mask for forming different thickness distributions, but not limited thereto. More specifically, the patterned photoresist layer 245 may be relatively thicker in a first thickness region 245A and relatively thinner in a second thickness region 245B. The patterned photoresist layer 245 with different thicknesses may be employed in both the patterning process of the oxide conductive layer 250 and the patterning process of the second metal layer 240, and the purposes of mask reduction and photolithographic process simplification may be achieved accordingly. As shown in FIG. 6, in the manufacturing method of this embodiment, the patterned photoresist layer 245 may be used to remove the oxide conductive layer 250 and the second metal layer 240 uncovered by the patterned photoresist layer 245 to form the oxide source electrode 250S and the oxide drain electrode 250D. Consequently, as shown in FIG. 7, an ashing process is performed to remove the patterned photoresist layer 245 in the second thickness region 245B and keep the patterned photoresist layer 245 in the first thickness region 245A. As shown in FIG. 8, the second metal layer 240 uncovered by the patterned photoresist layer 245 in the second thickness region 245B is then removed to form the metal connection component 240L. As shown in FIG. 9, the oxide semiconductor layer 260, the protection layer 270, the first contact opening 270V and the pixel electrode 280 are then formed sequentially after a process of removing the patterned photoresist layer (not shown in FIG. 9) on the metal connection component 240L.

As shown in FIG. 9, an oxide semiconductor thin film transistor 300 is provided in this embodiment. The difference between oxide semiconductor thin film transistor 300 and the first preferred embodiment is that the oxide source electrode 250S and the oxide drain electrode 250D in the oxide semiconductor thin film transistor 300 are formed before the process of forming the metal connection component 240L, and the oxide source electrode 250S is at least partially disposed between the metal connection component 240L and the substrate 210. However, the processes of forming the metal connection component 240L, the oxide source electrode 250S and the oxide drain electrode 250D will not influence the oxide semiconductor layer 260, and the oxide semiconductor layer 260 will not be influenced by edge surface condition of the metal connection component 240L because the metal connection component 240L, the oxide source electrode 250S and the oxide drain electrode 250D are formed before the process of forming the oxide semiconductor layer 260, and the metal connection component 240L does not overlap the oxide semiconductor layer 260 in the vertical projective direction Z. Any portion of the metal connection component 240L located in a region where the oxide source electrode 250S overlaps the metal connection component 240L directly contacts the oxide source electrode 250S for forming the electrical connection. The electrical connection between the oxide source electrode 250S and the metal connection component 240L will not be influenced by the edge contour of the metal connection component 240L because the oxide source electrode 250S directly contacts the bottom of the metal connection component 240 for forming the electrical connection. Apart from the disposition sequence of the oxide source electrode 250S and the metal connection component 240L, the material properties and the allocations of other components are similar to those of the first preferred embodiment detailed above and will not be redundantly described.

Figure 10:
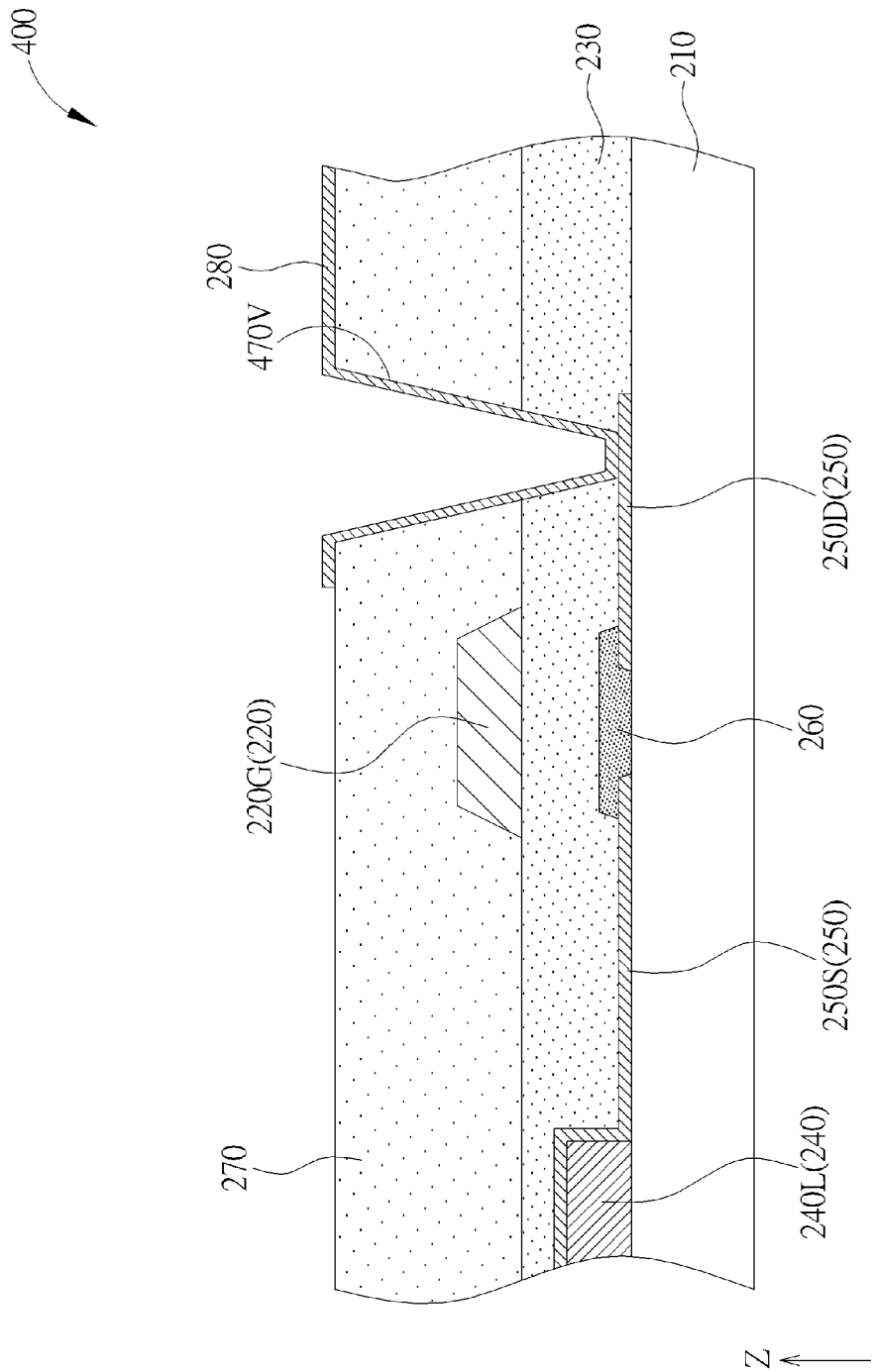
FIG. 10 is a schematic diagram illustrating an oxide semiconductor thin film transistor according to a third preferred embodiment of the present invention.

Please refer to FIG. 10. FIG. 10 is a schematic diagram illustrating an oxide semiconductor thin film transistor according to a third preferred embodiment of the present invention. As shown in FIG. 10, an oxide semiconductor thin film transistor 400 is provided in this embodiment. The difference between oxide semiconductor thin film transistor 400 and the first preferred embodiment is that the oxide semiconductor thin film transistor 400 further includes a second contact opening 470V. In this embodiment, the gate insulation layer 230 is disposed between the substrate 210 and the gate electrode 220G. The oxide semiconductor layer 260, the oxide source electrode 250S, the oxide drain electrode 250D and the metal connection component 240L are disposed between the gate insulation layer 230 and the substrate 210. The second contact opening 470V is disposed in the protection layer 270 and the gate insulation layer 230 to at least partially exposes the oxide drain electrode 250D. The pixel electrode 280 is disposed on the protection layer 270, and the pixel electrode 280 is electrically connected to the oxide drain electrode 250D via the second contact opening 470V. In other words, the metal connection component 240L, the oxide source electrode 250S/the oxide drain electrode 250D, and the oxide semiconductor layer 260 are sequentially formed on the substrate 210 first, and the gate insulation layer 230 is then formed to cover the metal connection component 240L, the oxide source electrode 250S/the oxide drain electrode 250D, and the oxide semiconductor layer 260. The gate electrode 220G is formed on the gate insulation layer 230. The second contact opening is formed in the gate insulation layer 230 and the protection layer 270 after the process of forming the protection layer 270. The oxide semiconductor thin film transistor 400 in this embodiment may be regarded as a top-gate thin film transistor structure, and the oxide semiconductor thin film transistors in the first preferred embodiment and the second preferred embodiment may be regarded as bottom-gate thin film transistor structures. It is worth noting that, in another preferred embodiment of the present invention, a top-gate thin film transistor structure may also be applied with the process of forming the oxide source electrode 250S before the metal connection component 240L as described in the second preferred embodiment.

To summarize the above descriptions, in the oxide semiconductor thin film transistor of the present invention, the oxide conductive material is used to form the oxide source electrode and the oxide drain electrode in the coplanar thin film transistor structure with bottom contacted oxide semiconductor layer. The oxide semiconductor layer may be kept from being influenced by the process of forming the source electrode and the drain electrode, and the electrical performance of the oxide semiconductor layer may not be influenced by the edge conduction of the conventional metal source/drain electrode. In addition, the oxide source electrode and the oxide drain electrode may also be used to reduce the contact resistance between the oxide semiconductor layer and the source/drain electrode, and the purposes of yield enhancement and improvement of the electrical performance of the oxide semiconductor thin film transistor may be achieved accordingly.

What is claimed is:

1. An oxide semiconductor thin film transistor, comprising:
   a substrate;
   a gate electrode, disposed on the substrate;
   an oxide semiconductor layer, disposed on the substrate;
   a gate insulation layer, at least partially disposed between the gate electrode and the oxide semiconductor layer;
   an oxide source electrode and an oxide drain electrode, wherein the oxide source electrode and the oxide drain electrode are disposed at least partially between the substrate and the oxide semiconductor layer respectively; and
   a metal connection component, disposed on the substrate, wherein the metal connection component overlaps the oxide source electrode in a vertical projective direction perpendicular to the substrate, the metal connection component does not overlap the oxide semiconductor layer in the vertical projective direction, and any portion of the metal connection component located in a region where the oxide source electrode respectively overlaps the metal connection component directly contacts the oxide source electrode for forming electrical connection.

2. The oxide semiconductor thin film transistor of claim 1, wherein the metal connection component is disposed between the oxide source electrode and the substrate.

3. The oxide semiconductor thin film transistor of claim 1, wherein the oxide source electrode is at least partially disposed between the metal connection component and the substrate.

4. The oxide semiconductor thin film transistor of claim 1, further comprising a pixel electrode, electrically connected with the oxide drain electrode.

5. The oxide semiconductor thin film transistor of claim 4, further comprising a protection layer and a first contact opening, wherein the protection layer covers the gate electrode, the gate insulation layer, the oxide semiconductor layer, the oxide source electrode, the oxide drain electrode and the metal connection component, the gate electrode is disposed between the substrate and the gate insulation layer, the first contact opening is disposed in the protection layer to at least partially expose the oxide drain electrode, the pixel electrode is disposed on the protection layer, and the pixel electrode is electrically connected with the oxide drain electrode via the first contact opening.

6. The oxide semiconductor thin film transistor of claim 4, further comprising a protection layer and a second contact opening, wherein the protection layer covers the gate electrode, the gate insulation layer, the oxide semiconductor layer, the oxide source electrode, the oxide drain electrode and the metal connection component, the gate insulation layer is disposed between the gate electrode and the substrate, the second contact opening is disposed in the protection layer and the gate insulation layer to at least partially expose the oxide drain electrode, the pixel electrode is disposed on the protection layer, and the pixel electrode is electrically connected with the oxide drain electrode via the second contact opening.

7. The oxide semiconductor thin film transistor of claim 1, wherein the metal connection component comprises a data line.

8. The oxide semiconductor thin film transistor of claim 1, wherein the oxide source electrode and the oxide drain electrode comprise oxide conductive material.

9. The oxide semiconductor thin film transistor of claim 1, wherein the oxide semiconductor layer comprises indium gallium zinc oxide, zinc oxide, magnesium zinc oxide, stannum stibium oxide, zinc selenium oxide or zinc zirconium oxide.

* * * * *